(12) United States Patent
Arkas et al.

(10) Patent No.: US 6,246,276 B1
(45) Date of Patent: *Jun. 12, 2001

(54) CLOCK SIGNAL CLEANING CIRCUIT

(75) Inventors: Evan Arkas; Nicholas Arkas, both of London (GB)

(73) Assignee: Advanced Intelligence, Inc., Victoria (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,423

(22) PCT Filed: Oct. 24, 1996

(86) PCT No.: PCT/CA96/00706

§ 371 Date: Nov. 20, 1998

§ 102(e) Date: Nov. 20, 1998

(87) PCT Pub. No.: WO97/16901

PCT Pub. Date: May 9, 1997

(30) Foreign Application Priority Data

Nov. 2, 1995 (CA) .................................................. 2161982

(51) Int. Cl.⁷ ..................................................... H03K 3/13
(52) U.S. Cl. ............................ 327/292; 327/166; 327/18; 327/23; 327/34; 375/371
(58) Field of Search ..................................... 327/292, 291, 327/293–295, 261, 165, 166, 18, 20, 26, 23, 25, 34, 35, 119; 386/85, 89, 90; 375/371

(56) References Cited

U.S. PATENT DOCUMENTS

| | | | |
|---|---|---|---|
| 3,599,103 | * 8/1971 | Nussbaumer | 327/90 |
| 4,649,438 | * 3/1987 | Shimizu et al. | 386/90 |
| 4,805,197 | 2/1989 | Van Der Jagt et al. | 375/361 |
| 5,349,612 | * 9/1994 | Guo et al. | 375/371 |

FOREIGN PATENT DOCUMENTS

0476968 A2  3/1992 (EP) .
0576150 A2  12/1993 (EP) .

* cited by examiner

*Primary Examiner*—Timothy P. Callahan
*Assistant Examiner*—Minh Nguyen
(74) *Attorney, Agent, or Firm*—Haynes and Boone LLP

(57) ABSTRACT

A device which reduces jitter and narrows the frequency spectrum of a jitter-ridden clock signal includes a basic unit having a plurality of series connected delay elements outputs from each delay element are all connected to an AND/NAND gate. A front end of the device locates missing clock pulses and ensures regular clock pulses are relayed to the remainder of the device. A succeeding section including plural basic units hones the signal such that jitter elements are removed. By the output of this section time duty cycles are uneven, a positive edge triggered flip-flop is then used to obtain 50% duty cycles at the expense of halving the clock signal's frequency. Optionally a frequency doubler can be employed to regain the clock signal's original frequency.

19 Claims, 2 Drawing Sheets

CLOCK SIGNAL CLEANING CIRCUIT

BACKGROUND OF THE INVENTION

1. Field of the Invention

This invention relates to jitter removing circuits, clock averagers and other clock signal correction devices.

2. Description of Related Art

At present jitter is controlled by prevention rather than cure. By the use of good design technique the effects of factors such as current surges, temperature, EM interference etc, are minimised. However there are many instances where despite such measures jitter is introduced into the system via transmission, mechanical devices and the like. Clock recovery systems, which recover clock signals distorted by transmission usually incorporate a high quality crystal which is used as a reference and as a source if a clock pulse is missing.

SUMMARY OF THE INVENTION

An object of the present invention is to provide an improved clock signal cleaning circuit. Presented is a device which removes jitter from a clock signal. The device is based upon a basic unit which is repeated throughout the device. The behaviour of this basic unit determines its jitter removal capabilities.

In its present embodiment the invention can be considered passive, however it is possible to include feedback loops connected to the oscillator to compensate for environmental conditions including aging.

The basic unit comprises a number of delay elements connected in series. The output of each delay is connected to the input of a multi-input AND gate. The output from the basic unit exhibits a narrower spectrum than the original spectrum. This statement must be qualified in that the actual signal emerges with an uneven duty cycle. By feeding the output from any of the basic units to a flip-flop a clock signal of half the original frequency is created with a 50% duty cycle because the times between positive to negative transitions is constant. After being passed through a frequency doubler the resulting spectrum of this signal is narrower than the original.

In an embodiment of the present invention a 'front end' includes a circuit which compensates for missing pulses. Conveniently, any number of basic units can be connected in series. Each of their outputs are fed into a respective flip-flop and to a respective AND gate. There are one less AND gates connected such that the output from only one basic unit is let through to an EXOR gate. The output from there is presented to various basic units of different size, all connected in series.

The output from there is fed to a flip-flop which corrects the uneven duty cycle but produces a signal whose frequency is half that input. Either this signal can be used, or the signal can be applied to a frequency doubler to create a clock signal at the original frequency.

A further embodiment of the present invention is directed to an electronic circuit for the reduction of jitter and temporary frequency drifts of a fixed oscillating source comprising:

an input, an output, a plurality of delay elements serially connected between the input and the output; and an NAND/AND gate having a plurality of inputs and an inverting and non-inverting output, each of said plurality of inputs of said NAND/AND gate being connected to a respective output of said plurality of delay elements;

said electronic circuit comprising a basic unit.

Other embodiments of this invention include the electronic circuit as described above along with a duty cycle recovery module, or a module that includes an edge triggered flip flop. This invention also relates to the electronic circuit as described above comprising a frequency doubler coupled to the output of the edge trigger flip flop.

Another embodiment of this invention includes the electronic circuit as defined above which comprises a missing clock pulse detection and substitution module which is coupled to the input of the electronic circuit.

Furthermore, this invention relates to a method for reducing jitter and temporary frequency drifts of a fixed oscillating source comprising the steps of successively delaying a jittery source signal to generate a plurality of delayed signals, and gating the plurality of delayed signals together to derive a clean signal.

Furthermore, this invention relates to this method further comprising successively delaying the cleaned signal to provide a plurality of delayed clean signals, detecting a missing pulse in one of the plurality of delayed clean signals, and substituting therefore another pulse and one of the plurality delayed clean clock signals, and outputting a single clean signal without a missing pulse.

This invention is also directed to the above comprising the deriving from a single clean signal, a third clock signal having a 50% duty cycle and a frequency of ½ that of the single clean cycle. This invention also encompasses the above method wherein the third signal is doubled to generate a fourth signal having a frequency equal to that of the single clean signal.

BRIEF DESCRIPTION OF DRAWINGS

The present invention will be further understood from the following description with reference to the drawings in which.

DETAILED DESCRIPTION

The present invention aims to eliminate jitter and compensate for the occasional missing pulse from clock signals. The key element of an embodiment of the invention is a basic unit shown in FIG. 1. It is passive in the sense that no feedback loops are employed. This does not mean that none can be; for example if there is no output it implies that the clock signal's frequency is outside the circuit's range and a feedback loop can be employed to control the crystal oscillator or clock source to bring the input frequency back within its range.

It is to be understood that the present invention is not limited to work within the confines of electricity, indeed the topologies described work equally well, theoretically if the medium is light or sound as well as electrons. The practicalities of implementing the design fall within those of good design practice. For example delay lines of considerable length might be employed. In this circumstance stable voltage and current sources must be used to reduce jitter caused by the simultaneous switching of all these jitter caused by the simultaneous switching of all these gates. In fact delay elements can be formed from complementary pairs to eliminate current surges.

Figure 1:
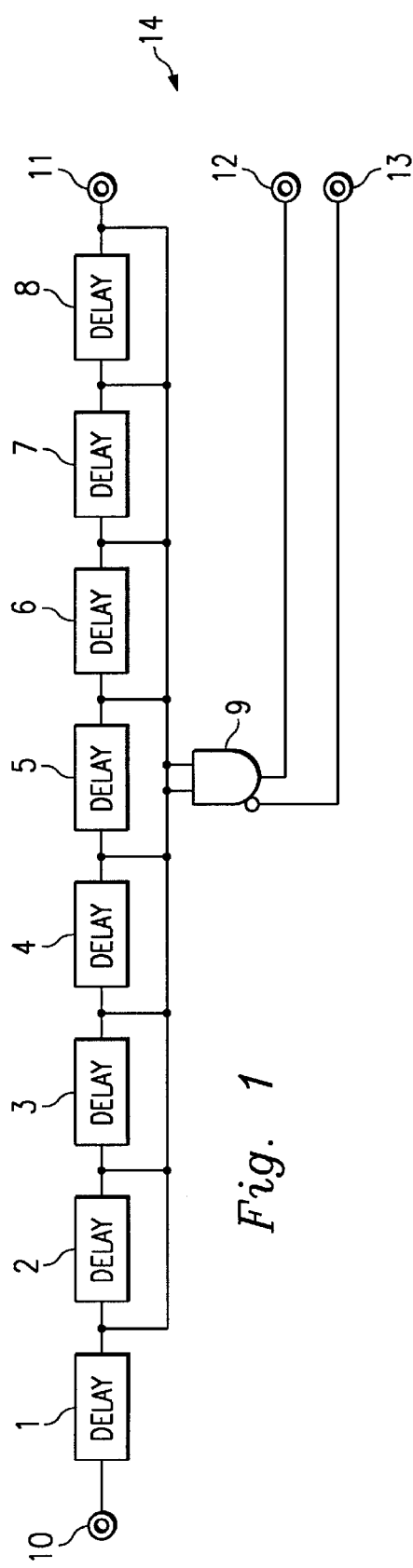
FIG. 1 schematically illustrates a basic unit in accordance with an embodiment of the present invention.

Referred to FIG. 1, there is schematically illustrated a basic unit in accordance with an embodiment of the present invention. This basic unit 14 consists of a number of delay elements 1–8 in series each having its output fed into a multi-input NAND/AND gate 9. The number of delay elements is arbitrary however the greater the number the narrower the range of frequencies from which the unit can accept an input. In general given a imperfect signal as input the basic unit will give out a signal whose duty cycle is uneven. This is corrected later.

Input 10 receives a signal direct from a crystal oscillator, other clock source or the output of another basic element. The signal propagates through the delay elements 1–8, the output at each element controls the output of the NAND/AND gate 9 which forms part of the basic unit. The output 11 outputs the signal as it enters from the input 10. The output (changed) 12 gives the basic unit's output and output (changed) 13 gives the inverse of 12.

A positive level from output (changed) 12 is only possible if all the levels presented at the inputs of the multi-input NAND/AND gate 9 are positive.

The delay of each element 1–8 must be identical and determines the 'ideal' frequency of the basic unit 14. Given a delay of x seconds then the 'ideal' or central frequency is $2\pi \div x$ Hz. In other words the delay introduced by each element must equal the period of the input frequency.

It is difficult to analyze the circuit in the time domain, it is instructive to see its behaviour in the frequency domain by studying its effect on certain types of signals presented to it.

When presented with a jitter-free, stable clock signal whose frequency is off from the ideal the basic unit 14 has no effect on the signal. The range of clock signal periods which are allowed through unaffected is given approximately by $$\frac{2\pi}{x \pm \frac{x}{2 \cdot n_t}} \text{ Hz},$$

where $n_t$ is the number of delay elements 1–8 in the basic unit 14 and x is the delay introduced by each delay element 1–8.

When presented with a signal containing a range of frequencies (introduced by jitter or other factors) the basic unit 14 narrows the range significantly. An interesting feature is that irrespective of whether or not the signal's frequencies are centred around the 'ideal' frequency the basic unit 14 narrows the frequency range and moves the spectrum's peak towards the ideal frequency. However the closer the original signal's central frequency is to the basic unit's 14 the narrower the output spectrum.

Figure 2:
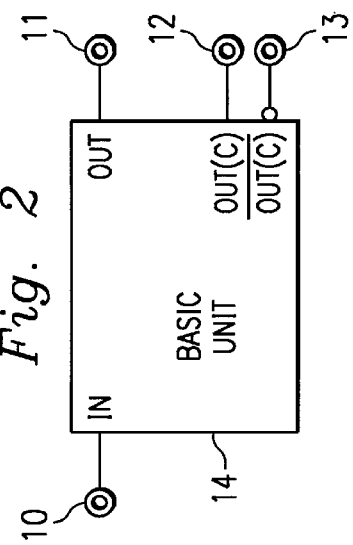
FIG. 2 illustrates a block representation of the basic unit of FIG. 1.

In FIG. 2, a block representation of the basic unit of FIG. 1 is shown.

Figure 3:
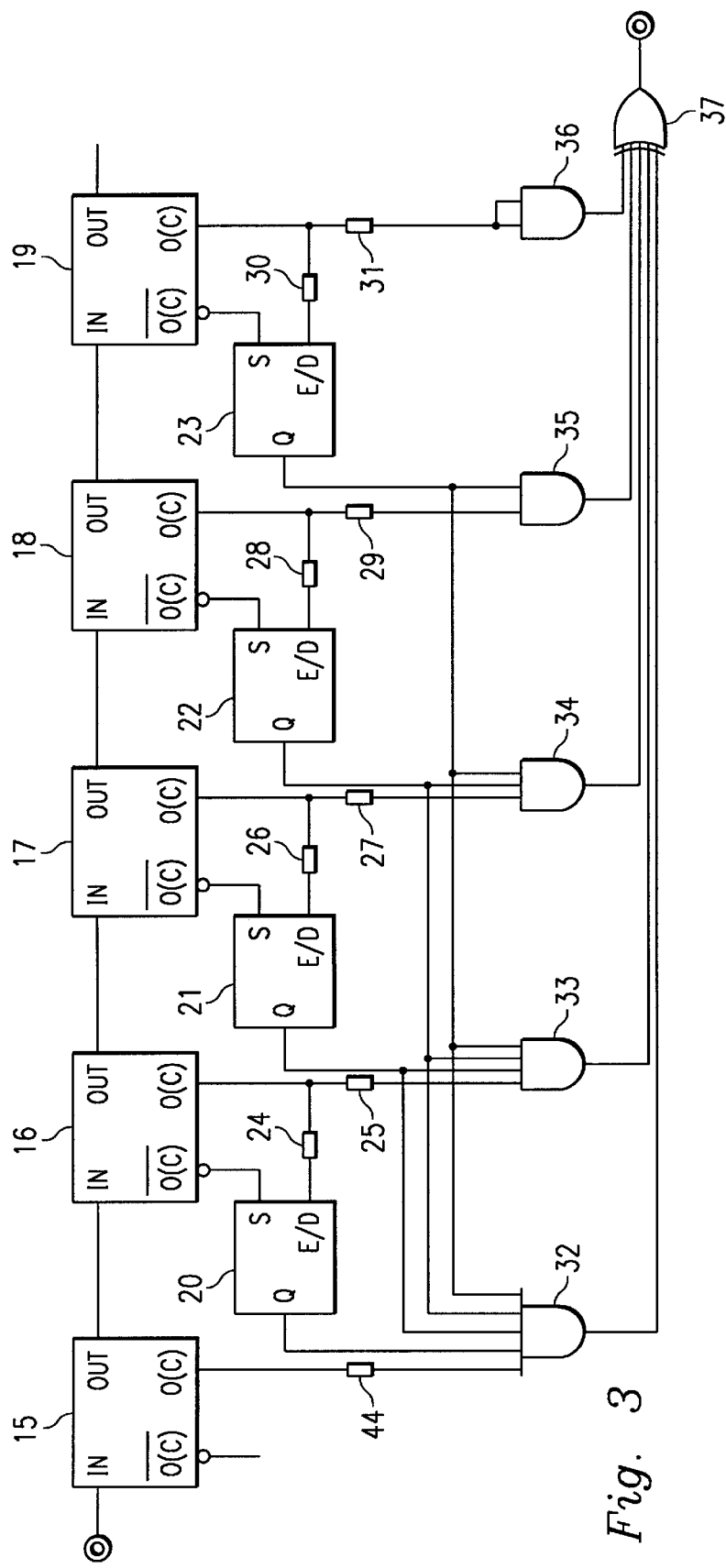
FIG. 3 illustrates a front end in accordance with an embodiment of the present invention.

Referring to FIG. 3, there is illustrated a front end in accordance with an embodiment of the present invention. The front end of the embodiment comprises a plurality of basic units 15–19, and a missing clock pulse detection and substitution module. The missing clock pulse detection and substitution module comprises a module input, module circuitry and a module output. The module input comprises inputs receiving the outputs of basic units 14–19. The module circuitry comprises a plurality of detecting circuits and a routing circuit. The detecting circuits include flip-flops 20–23. The routing circuit includes AND gates 32–36 and EXOR gate 37. The output of the EXOR gate 37 is defined as the modular output. The front end of the embodiment of the present invention is concerned with recognising the absence of clock pulses and compensating for them.

The front end of this embodiment includes five basic units 15–19, four flips-flops 20–23, five AND gates 32–36 and an EXOR gate 37. The basic blocks 15–19 are serially connected through their respective outputs. The non-inverting outputs of the basic units 15–19 are connected to inputs of their respective AND gates 32–36 via delay elements 25, 27, 29, 31. The inverting outputs of the basic units 16–19 are connected to inputs of their respective flip-flops 20–23. The outputs of the flip-flops 20–23 are connected to inputs of their respective preceding AND gates 32–35. The flip-flops 20–23 also receive at enable/disable inputs signals from the non-inverting outputs of their respective basic units 16–19 through delay elements 24, 26, 28, 30. The outputs of the AND gates 32–35 are connected to inputs of the EXOR gate 37.

The delay elements 44, 25, 27, 29, 31 provide a delay equal to that of the flip-flops 20–23 so that the signal paths to the AND gate have the same propagation delay. The delay elements 24, 26, 28, 30 at the enable/disable input of the flip-flops 20–23 are adjusted so that the flip-flop can identify an absent clock pulse and an actual clock pulse. It also serves to reset the device.

The flip-flops 20–23 ensure that the output from only one basic unit 15–19 reaches the EXOR gate 37. When no clock pulse is missing, the output of the flip-flop 23 blocks the preceding AND gates 32–35 and only the output of AND gate 36 reaches the EXOR gate 37. If a clock pulse is missed in a basic block (e.g. in basic block 19), then the output from the basic unit containing the missing clock pulse (e.g. basic block 19) does not reach the EXOR gate 37. The output of the preceding AND gate (e.g. AND gate 35) is unblocked, and the signal from the preceding basic unit (e.g. basic block 18) reaches to the EXOR gate 37 to compensate the missing clock pulse in the basic unit 19.

Figure 4:
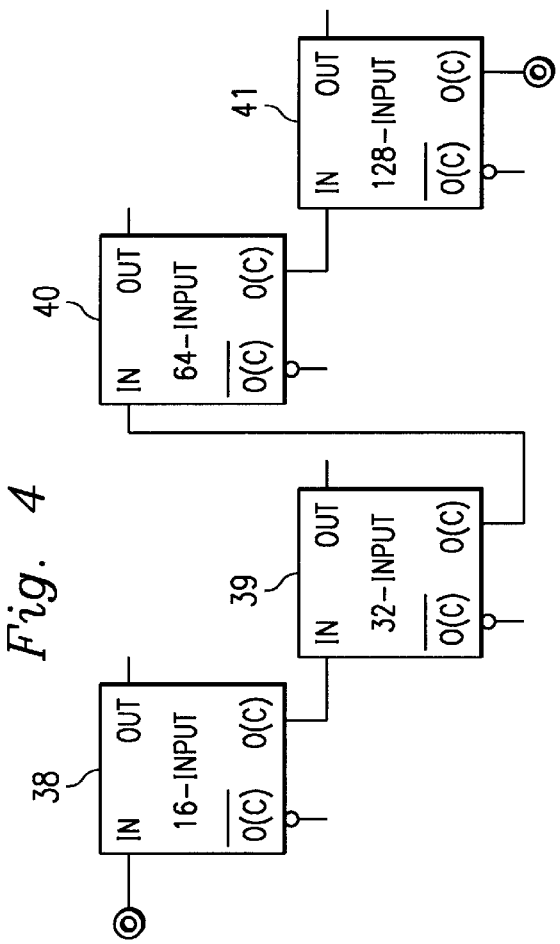
FIG. 4 illustrates an embodiment of the present invention for the middle section following the front end.

Referring to FIG. 4, there is shown a middle section in accordance with an embodiment of the present invention. Following the front end of FIG. 3, the signal then goes to a section including four basic units 38–41 each having an increasing number of delay elements. The actual topology of this section can be anything that works; experimentation will reveal the best ways of connecting basic elements 38–41 of any size and number for the particular application. By using increasingly larger numbers of delay elements the resulting signal will have a much narrower frequency spectrum.

Figure 5:
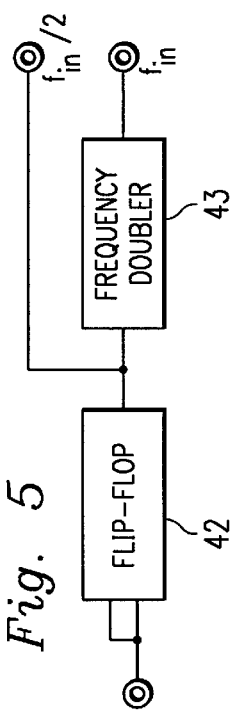
FIG. 5 illustrates an embodiment of the present invention for the backend.

Referring to FIG. 5, there is illustrated the back end in accordance with an embodiment of the present invention. Following the middle section, the signal is then presented to flip-flop 42 and optionally a frequency doubler 43. By the time the signal reaches this stage it may generally consist of a very short positive cycle and a very long negative half-cycle. The times between negative to positive transactions are constant. Small deviations may occur periodically which are caused by the signal going out of phase with the delay elements 1–8.

Thus by using a positive edge triggered flip-flop 42 a signal with a 50% duty cycle, at the expense of halving the signal's frequency, is produced. If desired, a frequency doubler 43 can be employed to regain regenerate a clock signal of the original frequency.

Numerous other modifications, variations and adaptions may be made to the particular embodiment of the invention described above without departing from the scope of the invention as defined in the claims:

What is claimed is:

1. An electronic circuit for processing a clock signal generated by a fixed oscillating source, the clock signal having potential jitter, temporary frequency drifts and missing clock pulses, the circuit comprising:
   a plurality of basic units provided in series, each basic unit having:
   a unit input for receiving the clock signal;
   a unit output for outputting the clock signal;
   unit circuitry having a plurality of delay elements serially connected between the unit input and the unit output for reducing jitter and temporary frequency drifts of the clock signal;
   a changed clock signal output for outputting a changed clock signal generated by the unit circuitry; and
   a missing clock pulse detection and substitution module having:
   a module input for receiving the changed clock signal from the unit output of each basic unit;
   module circuitry having a plurality of detecting circuits to detect a missing pulse in the changed clock signal received from each basic unit, and a routing circuit for routing the changed clock signal received from one of the basic units, the one of the basic units having no missing clock pulse; and
   a module output for outputting the changed clock signal routed by the module circuitry.

2. The electronic circuit of claim 1, wherein the module circuitry of the missing clock pulse detection and substitution module includes:
   a plurality of flip-flops each for receiving an inverted signal of the changed clock signal generated by a corresponding one of the basic unit, each flip-flop having a flip-flop output;
   a plurality of AND gates having a plurality of inputs, each AND gate, other than a last one, receiving the changed clock signal from the changed clock signal output of its respective one of the basic units and a signal from at least one of the flip-flops coupled to one of the basic units that is located downstream of the respective one of the basic units; and
   an XOR gate connected to the outputs of the AND gates.

3. The electronic circuit of claim 2, wherein each flip-flop has an enable/disable input which is coupled to the non-inverting output of its respective one of the basic units.

4. The electronic circuit of claim 1 wherein the unit circuitry of the basic unit further comprises:
   an NAND/AND gate having a plurality of inputs and an inverting and non-inverting output, each of said plurality of inputs of said NAND/AND gate being connected to a respective output of said plurality of delay elements so that the changed clock signal output from the non-inverting output has reduced jitter and temporary frequency drifts.

5. The electronic circuit of claim 1 further comprising a duty cycle recovery module.

6. The electronic circuit of claim 5, wherein the duty cycle recovery module includes an edge-triggered flip-flop.

7. The electronic circuit of claim 6, further comprising a frequency doubler coupled to an output of the edge-triggered flip-flop.

8. An electronic circuit for processing a clock signal generated by a fixed oscillating source, the clock signal having potential jitter, temporary frequency drifts and missing clock pulses, the circuit comprising:
   a plurality of basic units provided in series, each basic unit having:
   a unit input for receiving the clock signal;
   a unit output for outputting the clock signal;
   unit circuitry means for reducing jitter and temporary frequency drifts of the clock signal;
   a changed clock signal output for outputting a changed clock signal generated by the unit circuitry means; and
   a missing clock pulse detection and substitution module having:
   a module input for receiving the changed clock signal from the unit output of each basic unit;
   module circuitry means for routing the changed clock signal received from one of the basic units, the one of the basic units having no missing clock pulse; and
   a module output for outputting the changed clock signal routed by the module circuitry means.

9. The electronic circuit of claim 8 wherein the unit circuitry means of the basic unit comprises:
   a plurality of delay elements serially connected between the unit input and the unit output; and
   an NAND/AND gate having a plurality of inputs and an inverting and non-inverting output, each of said plurality of inputs of said NAND/AND gate being connected to a respective output of said plurality of delay elements so that the changed clock signal output from the non-inverting output has reduced jitter and temporary frequency drifts.

10. The electronic circuit of claim 9, wherein the duty cycle recovery module includes an edge-triggered flip-flop.

11. The electronic circuit of claim 10, wherein each flip-flop has an enable/disable input which is coupled to the non-inverting output of its respective one of the basis units.

12. The electronic circuit of claim 8 further comprising a duty cycle recovery module.

13. The electronic circuit 12, further comprising a frequency doubler coupled to an output of the edge-triggered flip-flop.

14. The electronic circuit of claim 8, wherein the module circuitry means of the missing clock pulse detection and substitution module includes:
   a plurality of flip-flops each for receiving an inverted signal of the changed clock signal generated by a corresponding one of the basic unit, each flip-flop having a flip-flop output;
   a plurality of AND gates having a plurality of inputs, each AND gate, other than a least one, receiving the changed clock signal from the changed clock signal output of its respective one of the basic units and a signal from at least one of the flip-flops coupled to one of the basic units that is located downstream of the respective one of the basic units: and
   an XOR gate connected to the outputs of the AND gates.

15. A method for processing a clock signal generated by a fixed oscillating source, the clock signal having potential jitter, temporary frequency drifts and missing clock pulses, the method comprising the steps of:
   reducing jitter and temporary frequency drifts from the clock signal to provide a plurality of changed clock signals,
   detecting a missing pulse in one of the plurality of changed clock signals, obtaining a pulse corresponding to the missing pulse from a different one of the plurality of changed clock signals, compensating the missing pulse by the pulse obtained from the different one of the plurality of changed clock signals, and outputting a single clock signal without a missing pulse.

16. The method of claim 15 wherein the step of reducing jitter comprises:

successively delaying the clock signal to provide a plurality of delayed clock signals;

gating the plurality of delayed clock signals together to derive a changed clock signal having reduced jitter and temporary frequency drifts.

17. The method of claim 16, further comprising deriving from the single clock signal, a third clock signal having a 50% duty cycle and a frequency of one-half that of the single clock signal.

18. The method of claim 17, further comprising doubling the third signal to generate a fourth signal having a frequency equal to that of the single clock signal.

19. The method of claim 15, wherein the step of obtaining a pulse comprises obtaining a following pulse that follows the missing pulse, and the step of compensating uses the following pulse for the missing pulse.

* * * * *